(12) United States Patent
Watanabe et al.

(10) Patent No.: US 9,324,663 B2
(45) Date of Patent: Apr. 26, 2016

(54) SEMICONDUCTOR DEVICE INCLUDING A PLURALITY OF MAGNETIC SHIELDS

(71) Applicant: RENESAS ELECTRONICS CORPORATION, Kawasaki-shi (JP)

(72) Inventors: Takahito Watanabe, Kawasaki (JP); Shintaro Yamamichi, Kawasaki (JP); Yoshitaka Ushiyama, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/273,177

(22) Filed: May 8, 2014

(65) Prior Publication Data

US 2014/0239425 A1    Aug. 28, 2014

Related U.S. Application Data

(63) Continuation of application No. 13/200,944, filed on Oct. 5, 2011, now Pat. No. 8,749,033.

(30) Foreign Application Priority Data

Nov. 15, 2010    (JP) ................................ 2010-255088

(51) Int. Cl.
*H01L 23/552* (2006.01)
*H01L 29/82* (2006.01)
(Continued)

(52) U.S. Cl.
CPC ............... *H01L 23/58* (2013.01); *H01L 23/13* (2013.01); *H01L 23/552* (2013.01); *H01L 24/29* (2013.01);
(Continued)

(58) Field of Classification Search
CPC ....... H01L 23/58; H01L 27/224; H01L 23/13; H01L 23/552; H01L 24/29; H01L 24/32
USPC .......... 257/422, 659, 728, 780, E21.502, 660, 257/717, E21.499; 438/113, 765, 119; 365/158
See application file for complete search history.

(56) References Cited

U.S. PATENT DOCUMENTS 5,902,690 A    5/1999   Tracy et al.
6,548,898 B2   4/2003   Matsuki et al.
(Continued)

FOREIGN PATENT DOCUMENTS

JP    10-022341 A    1/1998
JP    2002-203925 A  7/2002
(Continued)

OTHER PUBLICATIONS

Japanese Office Action dated May 20, 2014 with an English Translation.

(Continued)

*Primary Examiner* — Long K Tran
*Assistant Examiner* — Dzung Tran
(74) *Attorney, Agent, or Firm* — McGinn IP Law Group, PLLC

(57) ABSTRACT

A semiconductor device includes a semiconductor chip having a first main surface, a second main surface opposite to the first main surface, a side surface arranged between the first main surface and the second main surface, and a magnetic storage device, a first magnetic shield overlaying on the first main surface, a second magnetic shield overlaying on the second main surface, and a third magnetic shield overlaying on the side surface. The first and second magnetic shields are mechanically connected via the third magnetic shield.

24 Claims, 30 Drawing Sheets

(51) Int. Cl.
*H01L 23/34* (2006.01)
*H01L 23/48* (2006.01)
*H01L 23/58* (2006.01)
*H01L 23/13* (2006.01)
*H01L 27/22* (2006.01)
*H01L 23/31* (2006.01)
*H01L 23/498* (2006.01)
*H01L 23/00* (2006.01)

(52) U.S. Cl.
CPC .............. H01L 24/32 (2013.01); H01L 27/224 (2013.01); *H01L 23/3128* (2013.01); *H01L 23/49816* (2013.01); *H01L 24/05* (2013.01); *H01L 24/16* (2013.01); *H01L 24/97* (2013.01); *H01L 2223/54426* (2013.01); *H01L 2224/0401* (2013.01); *H01L 2224/16225* (2013.01); *H01L 2224/291* (2013.01); *H01L 2224/2916* (2013.01); *H01L 2224/2919* (2013.01); *H01L 2224/29101* (2013.01); *H01L 2224/97* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01079* (2013.01); *H01L 2924/01082* (2013.01); *H01L 2924/0665* (2013.01); *H01L 2924/12041* (2013.01); *H01L 2924/1435* (2013.01); *H01L 2924/15159* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 6,625,040 | B1 * | 9/2003 | Tuttle .................. 361/816 |
| 6,784,543 | B2 | 8/2004 | Matsuki et al. |
| 6,838,748 | B2 | 1/2005 | Ishio et al. |
| 7,485,976 | B2 | 2/2009 | Knudsen |
| 8,749,033 | B2 | 6/2014 | Watanabe et al. |
| 2003/0132494 | A1 | 7/2003 | Tuttle et al. |
| 2003/0218257 | A1 | 11/2003 | Ishio et al. |
| 2005/0104165 | A1 | 5/2005 | Ishio et al. |
| 2005/0116255 | A1 | 6/2005 | Kato et al. |
| 2005/0207263 | A1 | 9/2005 | Okayama et al. |
| 2006/0289970 | A1 * | 12/2006 | Gogl et al. ............... 257/659 |
| 2007/0285957 | A1 | 12/2007 | Stobbs |
| 2008/0116535 | A1 * | 5/2008 | Molla et al. .............. 257/422 |
| 2008/0122047 | A1 | 5/2008 | Honer et al. |
| 2008/0237846 | A1 * | 10/2008 | Terui et al. .............. 257/717 |
| 2009/0045488 | A1 | 2/2009 | Chang et al. |
| 2009/0050992 | A1 | 2/2009 | Kools et al. |
| 2010/0105171 | A1 * | 4/2010 | Lee et al. ................. 438/113 |
| 2010/0139962 | A1 | 6/2010 | Kaneko |
| 2010/0140759 | A1 * | 6/2010 | Pagaila et al. ........... 257/660 |
| 2011/0316129 | A1 * | 12/2011 | Katti ......................... 257/659 |
| 2012/0273926 | A1 * | 11/2012 | Pagaila .................... 257/659 |
| 2014/0239425 | A1 | 8/2014 | Watanabe et al. |

FOREIGN PATENT DOCUMENTS

| | | |
|---|---|---|
| JP | 2003-100942 A | 4/2003 |
| JP | 2003-115578 A | 4/2003 |
| JP | 2003-309196 A | 10/2003 |
| JP | 2003-347441 A | 12/2003 |
| JP | 2003-347441 A | 12/2003 |
| JP | 2004-172251 A | 6/2004 |
| JP | 2006-511936 A | 4/2006 |
| JP | 2010-10393 A | 1/2010 |
| JP | 2010-093277 A | 4/2010 |
| JP | 2010-141018 A | 6/2010 |
| JP | 2010-245106 | 10/2010 |
| JP | 2012-109307 A | 6/2012 |

OTHER PUBLICATIONS

U.S. Office Action in co-pending related U.S. Appl. No. 13/200,944, dated Feb. 8, 2013.

U.S. Office Action in co-pending related U.S. Appl. No. 13/200,944, dated Jun. 26, 2013.

Notice of Allowance in co-pending related U.S. Appl. No. 13/200,944, dated Feb. 3, 2014.

Chinese Notification of First Office Action dated Dec. 4, 2013 with English translation.

Japanese Office Action dated Dec. 9, 2014 with English translation thereof.

Japanese Office Action dated Feb. 23, 2016, with a partial English translation.

* cited by examiner 402  400  100

400  402  100

400  402  100

402 (100)    400

402 (100)    400

402 (100)    400

SEMICONDUCTOR DEVICE INCLUDING A PLURALITY OF MAGNETIC SHIELDS

CROSS-REFERENCE TO RELATED APPLICATIONS

This application is a Continuation application of U.S. patent application Ser. No. 13/200,944, filed Oct. 5, 2011, which is based on Japanese patent application No. 2010-255088, the entire content of which is incorporated hereinto by reference.

BACKGROUND

1. Technical Field

The present invention relates to a semiconductor device including a magnetoresistive random access memory and a method of manufacturing a semiconductor device.

2. Related Art

Developments have progressed for putting Magnetoresistive Random Access Memories (MRAMs) as one type of memory device into practical use. The MRAM is a device that writes information by rewriting the direction of the electron spin. An external magnetostatic field can cause information stored in the MRAM to be erroneously erased or written. In contrast to this, for example, as disclosed in Japanese Laid-open patent publication No. 2003-309196 and Japanese Laid-open patent publication No. 2003-347441, a structure has been studied for covering a semiconductor chip including a MRAM with an magnetic shield.

In order to suppress magnetism from leaking from the magnetic shield toward the semiconductor chip, as disclosed in Japanese Laid-open patent publication No. 2003-347441, it is preferable to directly cover the semiconductor chip with a magnetic shield layer. In a case where the semiconductor chip is directly covered with the magnetic shield layer, however, bumps needs to be higher than the magnetic shield layer for flip-chip mounting of the semiconductor chip on an interconnect substrate. In such a case, it is difficult to arrange the bumps at a small pitch.

SUMMARY

In one embodiment, there is provided a semiconductor device including: a semiconductor chip including a magnetic storage device and an electrode pad, the electrode pad being disposed over a first face of the semiconductor chip;
a magnetic shield layer coating the semiconductor chip so as to expose at least the electrode pad; and
an interconnect substrate connected through a bump to the semiconductor chip,
wherein at least one of the semiconductor chip and the interconnect substrate includes a convex portion, and the bump is disposed over the convex portion.

In another embodiment, at least one of the semiconductor chip and the interconnect substrate includes the convex portion. Accordingly, the height of the bump can be formed to be small. In addition, in accordance with this, the diameter of the bump can be formed to be small. Therefore, the bump can be arranged at a small pitch.

In another embodiment, there is provided a method of manufacturing a semiconductor device, the method comprising:
coating a semiconductor chip with a magnetic shield layer, the semiconductor chip including a magnetic storage device and an electrode pad, the electrode pad being disposed over a first face of the semiconductor chip, and the semiconductor chip being coated such that at least the electrode pad is exposed; and
connecting the semiconductor chip to an interconnect substrate through a bump,
wherein at least one of the semiconductor chip and the interconnect substrate includes a convex portion, and the bump is disposed over the convex portion.

The present invention enables the bumps to be arranged at a small pitch even if the semiconductor chip is coated with the magnetic shield layer.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
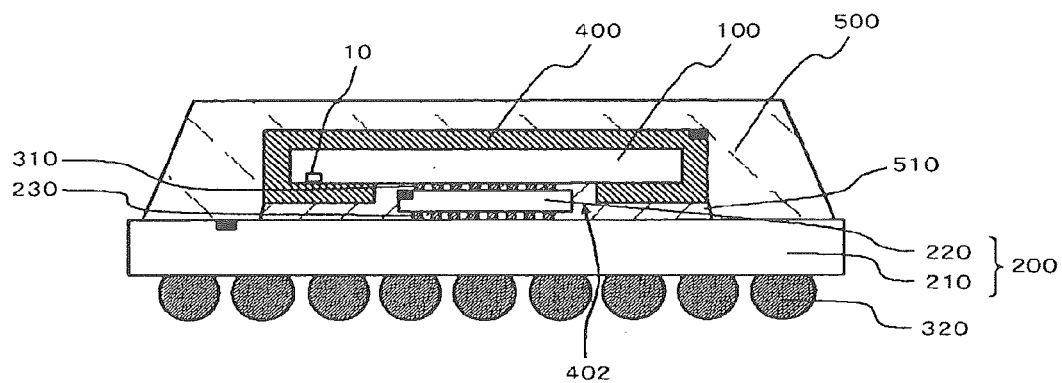
FIG. 1 is a cross-sectional view illustrating the configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the accompanying drawings. In all the drawings, the same reference numeral is assigned to the same constituent element, and the description thereof will not be repeated.

First Embodiment

FIG. 1 is a cross-sectional view illustrating the configuration of a semiconductor device according to a first embodiment. This semiconductor device includes a semiconductor chip 100, a magnetic shield layer 400, and an interconnect substrate 200. The semiconductor chip 100 includes a magnetoresistive RAM 10 and includes an electrode pad 110 (not shown in the figure). The electrode pad 110 is disposed on a first face of the semiconductor chip 100. The magnetic shield layer 400 covers the semiconductor chip 100 so as to expose at least the electrode pad 110. The semiconductor chip 100 is mounted on the interconnect substrate 200 through a bump 310. The connection form illustrated here, for example, is a flip-chip connection. At least one of the semiconductor chip 100 and the interconnect substrate 200 includes a convex portion, and the bump 310 is disposed on the convex portion. Detailed description will be presented below.

In this embodiment, the convex portion is disposed at the interconnect substrate 200. More specifically, the interconnect substrate 200 includes a first interconnect substrate 210 and a second interconnect substrate 220. When seen in a plan view, the second interconnect substrate 220 is smaller than the first interconnect substrate 210. The second interconnect substrate 220 is mounted on the first interconnect substrate 210 through the bump 230. The second interconnect substrate 220 thus configures the convex portion. The second interconnect substrate 220 has a face not facing the first interconnect substrate 210, and the face connects to the semiconductor chip 100 through the bump 310. The bumps 230 and 310, for example, are solder bumps. The first interconnect substrate 210 has a face opposite to the semiconductor chip 100, and on the face a soldering ball 320 is disposed as an external connection terminal.

Although the magnetic shield layer 400 covers at least a part of the first face (a face facing the interconnect substrate 200) of the semiconductor chip 100, the magnetic shield layer 400 does not overlap with the second interconnect substrate 220. More specifically, although the magnetic shield layer 400 covers almost the entire face (including the side face) of the semiconductor chip 100, an opening 402 is formed in an area facing the interconnect substrate 200 (it corresponds to FIG. 25A to be described later). When viewed in a plan view, the opening 402 is larger than the second interconnect substrate 220. Accordingly, the magnetic shield layer 400 does not interfere with the second interconnect substrate 220, and the second interconnect substrate 220 intrudes into the inside of the opening 402. The magnetic shield layer 400 is formed from a soft magnetic material such as iron, permalloy, sendust, silicon steel, or a nanocrystal. The thickness of the magnetic shield layer 400, for example, is equal to or more than 0.05 mm and equal to or less than 0.15 mm.

An underfill resin 510 seals a space between the semiconductor chip 100 and the interconnect substrate 200. The underfill resin 510 may be an epoxy-based resin or an imide-based resin. In this embodiment, the underfill resin 510 is also formed between the magnetic shield layer 400 and the second interconnect substrate 220. In other words, the underfill resin 510 seals also the second interconnect substrate 220.

Figure 2A:
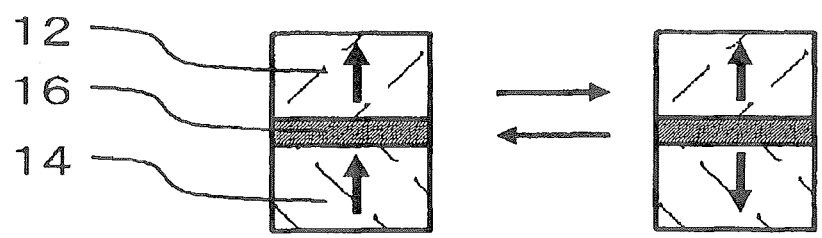
FIGS. 2A and 2B are diagrams illustrating the principle of a magnetoresistive random access memory.
Figure 2B:
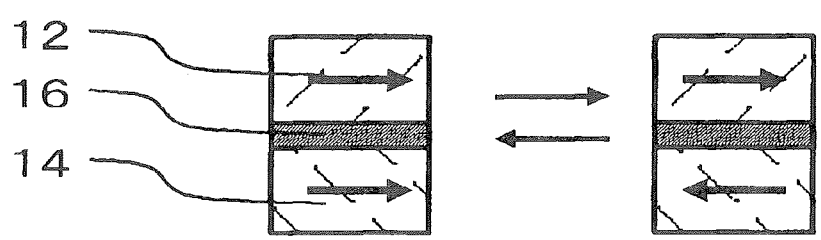

FIGS. 2A and 2B are diagrams illustrating the principle of a magnetoresistive random access memory 10. The magnetoresistive random access memory 10 has a structure in which a magnetic fixed layer 12 and a magnetic free layer 14 face each other through a tunnel barrier layer 16. The magnetoresistive random access memory 10 illustrated in FIG. 2A is a vertical spin-type element. Writing and erasing on the magnetoresistive random access memory 10 of this type takes place by a magnetic field in a direction perpendicular to the semiconductor chip 100. The magnetoresistive random access memory 10 illustrated in FIG. 2B is a horizontal spin-type element. Writing and erasing on the magnetoresistive random access memory 10 of this type takes place by a magnetic field in a direction horizontal to the semiconductor chip 100. The magnetoresistive random access memory 10 of any type is in a low-resistance state in a case where the magnetization directions of the magnetic fixed layer 12 and the magnetic free layer 14 are the same and is in a high-resistance state in a case where the magnetization directions of the magnetic fixed layer 12 and the magnetic free layer 14 are opposite to each other. Measurement takes place on the magnitude of a tunnel current passing through the tunnel barrier layer 16, and thus written information is read out. The magnetic shield layer 400 illustrated in FIG. 1 has a magnetic shield effect for the magnetoresistive random access memories 10 of any type illustrated in FIGS. 2A and 2B.

Figure 3A:
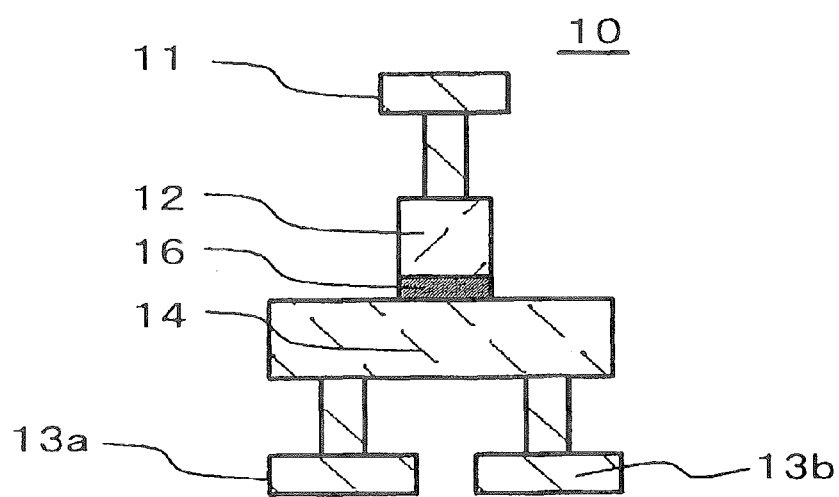
FIGS. 3A and 3B are diagrams illustrating the configuration of a magnetoresistive random access memory.
Figure 3B:
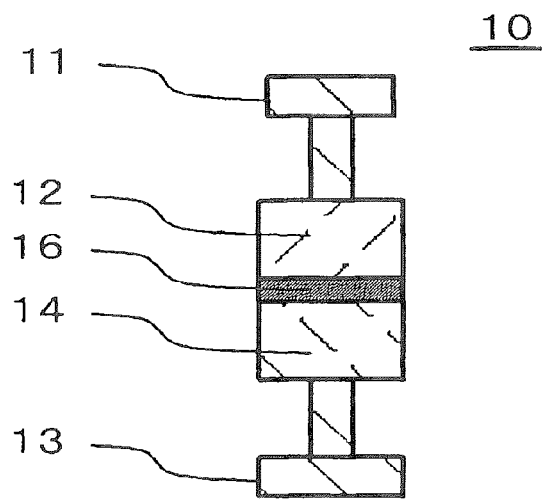

FIGS. 3A and 3B are diagrams illustrating the configuration of a magnetoresistive random access memory 10. The magnetoresistive random access memory 10 illustrated in FIG. 3A is a magnetic storage element of a magnetic-wall moving type. More specifically, the magnetic free layer 14 configures a magnetic-wall moving layer and connects to two bit lines 13a and 13b. The magnetic fixed layer 12 connects to a read-out line 11.

The magnetoresistive random access memory 10 illustrated in FIG. 3B is a magnetic storage element of a spin injecting type. More specifically, the magnetic free layer 14 connects to one bit line 13, and the magnetic fixed layer 12 connects to the read-out line 11.

The principle and the configuration of the magnetoresistive random access memory 10 have been described with reference to FIGS. 2A and 2B and FIGS. 3A and 3B, but the configuration of the magnetoresistive random access memory 10 to which the present invention can be applied is not limited to them, and for example, may be a magnetic storage device of a magnetic field moving type.

Figure 4A:
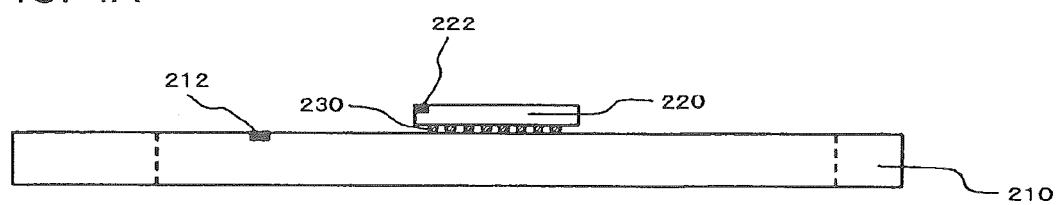
FIGS. 4A and 4B are cross-sectional views illustrating a method of manufacturing the semiconductor device illustrated in FIG. 1.

FIGS. 4A and 4B and FIGS. 5A and 5B are cross-sectional views illustrating a method of manufacturing a semiconductor device illustrated in FIG. 1. First, as illustrated in FIG. 4A, a bump 230 is used to mount a second interconnect substrate 220 on an undiced first interconnect substrate 210. The first interconnect substrate 210 includes a positioning mark 212, and the second interconnect substrate 220 includes a positioning mark 222. The positioning marks 212 and 222, for example, are parts of the interconnect layers and are conductive patterns exposed from protection layers. The positions of the positioning mark 212 and the positioning mark 222 are detected, and thus the second interconnect substrate 220 can be mounted precisely on the first interconnect substrate 210. The second interconnect substrates 220 are mounted on a plurality of areas of the first interconnect substrate 210 to be diced.

Figure 4B:
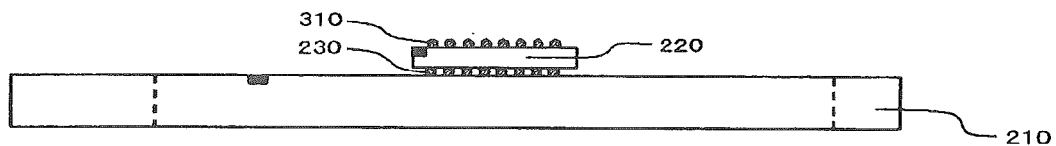

Next, as illustrated in FIG. 4B, on the second interconnect substrate 220 mounted on the first interconnect substrate 210, bumps 310 are formed altogether.

Figure 5A:
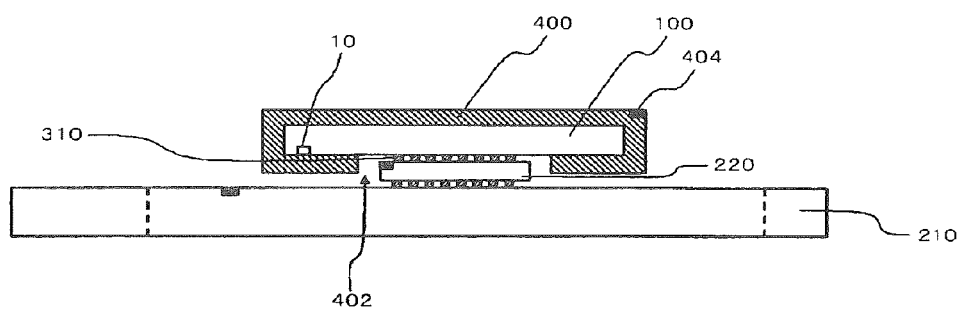
FIGS. 5A and 5B are cross-sectional views illustrating a method of manufacturing the semiconductor device illustrated in FIG. 1.

Next, as illustrated in FIG. 5A, a semiconductor chip 100 coated with a magnetic shield layer 400 is prepared. A plurality of components is attached to the semiconductor chip 100, for example, and the magnetic shield layer 400 can be formed.

Next, the bumps 310 are used to mount the semiconductor chip 100 on the second interconnect substrate 220. Since a positioning mark 404 is arranged in the magnetic shield layer 400, the semiconductor chip 100 is mounted precisely on the second interconnect substrate 220. The positioning mark 404, for example, has a specific form (including a depression) disposed on the magnetic shield layer 400.

In this state, a gap exists between the magnetic shield layer 400 and the first interconnect substrate 210. Accordingly, when the bumps 310 are hardened, the semiconductor chip 100 is positioned with respect to the second interconnect substrate 220 in a self-aligning manner.

Figure 5B:
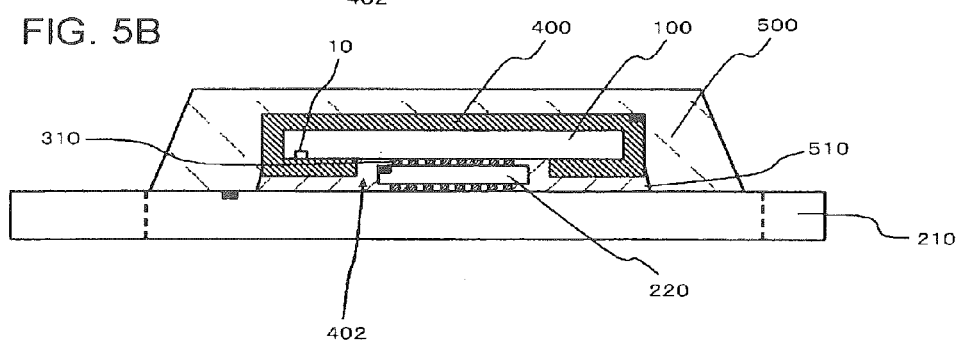

Next, as illustrated in FIG. 5B, according to a capillary phenomenon, an underfill resin 510 seals a gap between the magnetic shield layer 400 and the first interconnect substrate 210. At this time, the underfill resin 510 also penetrates into the gap between the magnetic shield layer 400 and the second interconnect substrate 220 according to the capillary phenomenon. Next, a plurality of the semiconductor chips 100 is individually sealed with a sealing resin 500.

The first interconnect substrate 210 is then cut along a dicing line (denoted by a dotted line), and a plurality of semiconductor devices is diced.

Next, the operations and the advantages of this embodiment will be described. According to this embodiment, the magnetic shield layer 400 has the opening 402 for exposing the electrode pad of the semiconductor chip 100. The opening 402 includes the second interconnect substrate 220 inside when seen in a plan view. Accordingly, in a case where the semiconductor chip 100 is mounted on the interconnect substrate 200, the top face of the second interconnect substrate 220 is located near the semiconductor chip 100 relative to the bottom face of the magnetic shield layer 400. As a result, the heights of the bumps 310 can be low. This enables the width of the bump 310 to be small. The bumps 310 can be thus arranged at a small pitch with high precision.

Second Embodiment

Figure 6:
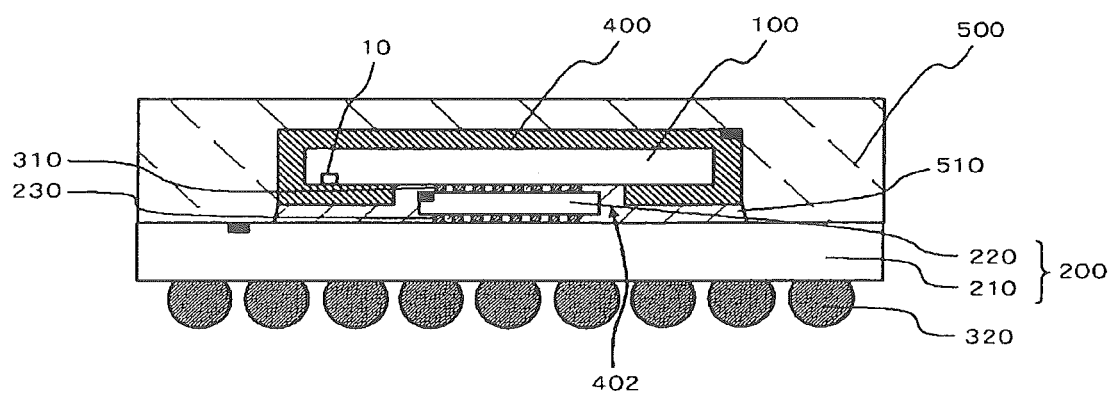
FIG. 6 is a cross-sectional view illustrating the configuration of a semiconductor device according to a second embodiment.

FIG. 6 is a cross-sectional view illustrating the configuration of a semiconductor device according to a second embodiment and corresponds to FIG. 1 according to the first embodiment. The semiconductor device according to this embodiment is similar to the configuration of the semiconductor device according to the first embodiment except for the shape of a sealing resin 500. More specifically, the side face of the sealing resin 500 forms the same face as the side face of the first interconnect substrate 210.

Figure 7A:
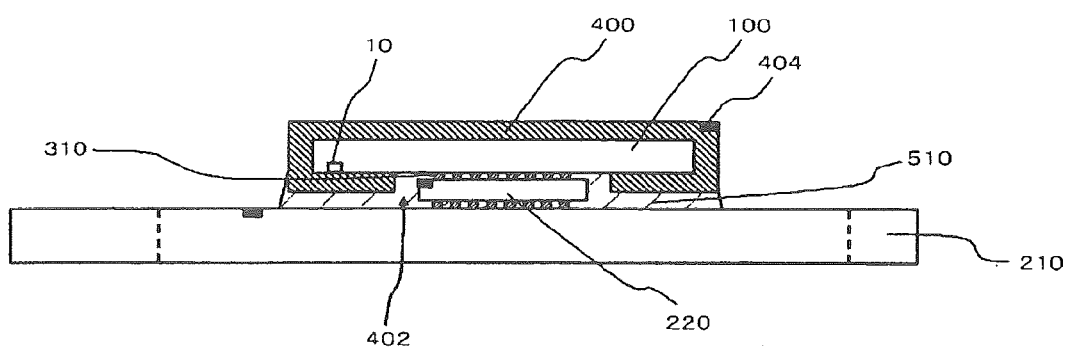
FIGS. 7A and 7B are cross-sectional views illustrating a method of manufacturing the semiconductor device illustrated in FIG. 6.
Figure 7B:
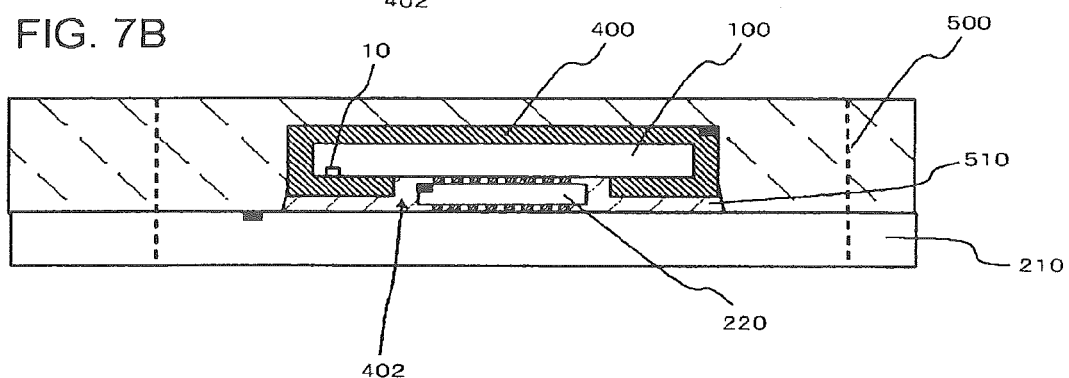

FIGS. 7A and 7B are cross-sectional views illustrating a method of manufacturing the semiconductor device illustrated in FIG. 6. First, as illustrated in FIG. 7A, a second interconnect substrate 220 is mounted on a first interconnect substrate 210, and on the second interconnect substrate 220, a semiconductor chip 100 coated with a magnetic shield layer 400 is further mounted. Next, an underfill resin 510 is formed. The process until now is the same as that according to the first embodiment.

Next, as illustrated in FIG. 7B, a plurality of the semiconductor chips 100 is sealed with the sealing resin 500 altogether. The sealing resin 500 and the first interconnect substrate 210 are then diced, and a plurality of semiconductor devices is diced.

According to this embodiment, advantages similar to those of the first embodiment can be acquired.

Third Embodiment

Figure 8A:
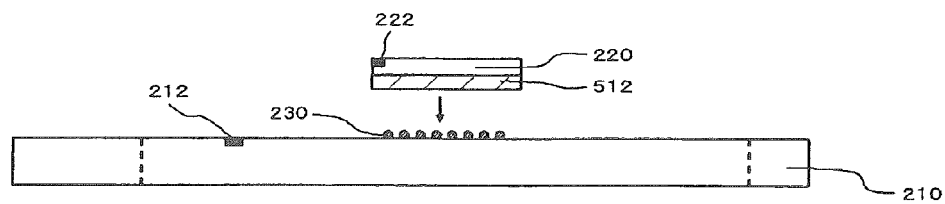
FIGS. 8A to 8C are cross-sectional views illustrating a method of manufacturing a semiconductor device according to a third embodiment.
Figure 8B:
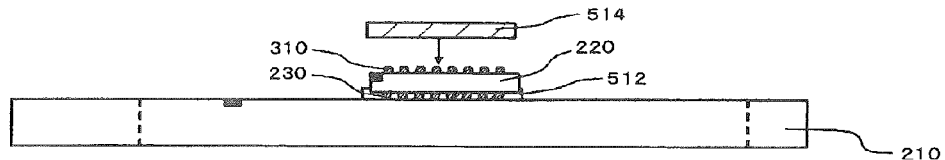
Figure 8C:
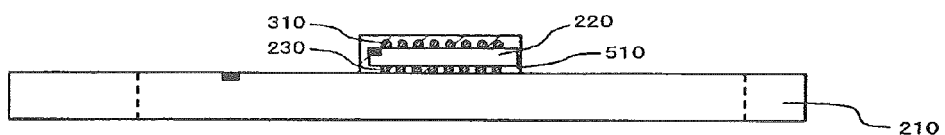

FIGS. 8A to 8C are cross-sectional views illustrating a method of manufacturing a semiconductor device according to a third embodiment. The method of manufacturing a semiconductor device according to this embodiment is similar to that of the semiconductor device according to the first or second embodiment except for a method of forming an underfill resin 510.

First as illustrated in FIG. 8A, bumps 230 are formed on a first interconnect substrate 210. Next, a lamination method, for example, is used to dispose an insulating resin film (Non Conductive Film (NCF)) 512 on the bottom face of a second interconnect substrate 220. Next, the second interconnect substrate 220 is mounted on the first interconnect substrate 210. The resin film 512 thus seals a space between the second interconnect substrate 220 and the first interconnect substrate 210.

Next, as illustrated in FIG. 8B, bumps 310 are disposed on the second interconnect substrate 220. Next, the lamination method is used to dispose a resin film (NCF) 514 on the bumps 310 and the second interconnect substrate 220. An underfill resin 510 is thus formed (FIG. 8C). In this step, although the underfill resin 510 seals the second interconnect substrate 220 and the bumps 310, the underfill resin has not been hardened.

Next, a semiconductor chip 100 coated with a magnetic shield layer 400 is mounted on the second interconnect substrate 220. At this time, the semiconductor chip 100 presses down the second interconnect substrate 220 with pressure to some degree. The bumps 310 thus contact with the semiconductor chip 100.

Next, the semiconductor chip 100, the interconnect substrate 200, and the bumps 310 are thermally treated and then cooled. Described in more detail, first, the underfill resin 510 is softened through heating so as to be buried in the bumps. The underfill resin 510 is then slowly hardened, and, in parallel with the hardening of the underfill resin 510, the bumps 310 are melted. Then, the bumps are solidified through a cooling process so as to be bonded to the semiconductor chip 100. A sealing resin 500 is then disposed.

In this embodiment, although the resin film 514 is disposed before the semiconductor chip 100 bonds to the second interconnect substrate 220, the resin film 514 may be disposed not on the top face of the second interconnect substrate 220 but on the bottom face of the semiconductor chip 100.

According to this embodiment, advantages that are similar to those of the first embodiment can be acquired. In addition, since the underfill resin 510 is formed with the resin films 512 and 514 before the semiconductor chip 100 is mounted to the second interconnect substrate 220, the underfill resin 510 can sufficiently seal the bumps 230 and 310 even if the pitch of the bumps 230 and 310 is small.

Fourth Embodiment

Figure 9:
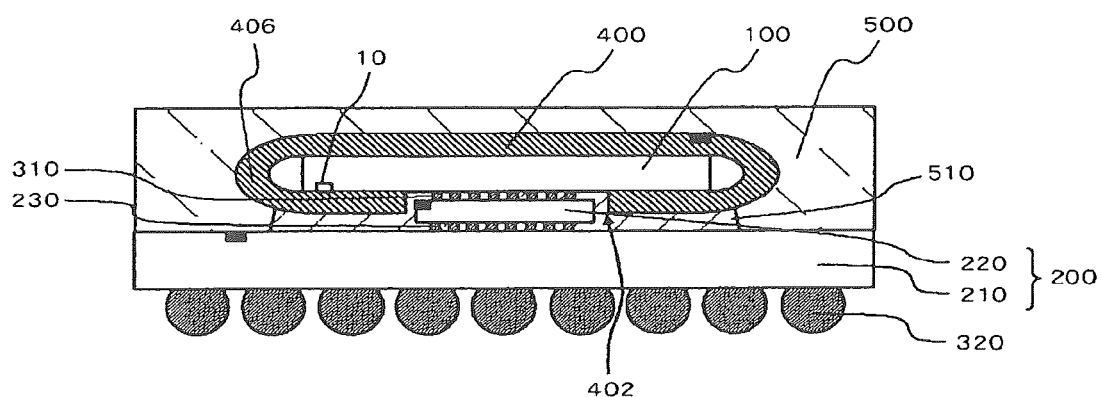
FIG. 9 is a cross-sectional view illustrating the configuration of a semiconductor device according to a fourth embodiment.

FIG. 9 is a cross-sectional view illustrating the configuration of a semiconductor device according to a fourth embodiment. The semiconductor device according to this embodiment is similar to one of the first to third embodiments except for the shape of a magnetic shield layer 400.

In this embodiment, a magnetic shield layer 400 has an area facing the side face of the semiconductor chip 100. In the area, the magnetic layer 400 includes a curved portion 406. In other words, there is a gap between the side face of the semiconductor chip 100 and the magnetic shield layer 400.

According to this embodiment, the advantages similar to those of the first to third embodiments can be acquired. In addition, since the magnetic shield layer 400 includes the curved portion 406, at least a part of the magnetic shield layer 400 can be formed if a thin steel plate is bent. Accordingly, the manufacturing cost of the magnetic shield layer 400 can be lowered.

Fifth Embodiment

Figure 10A:
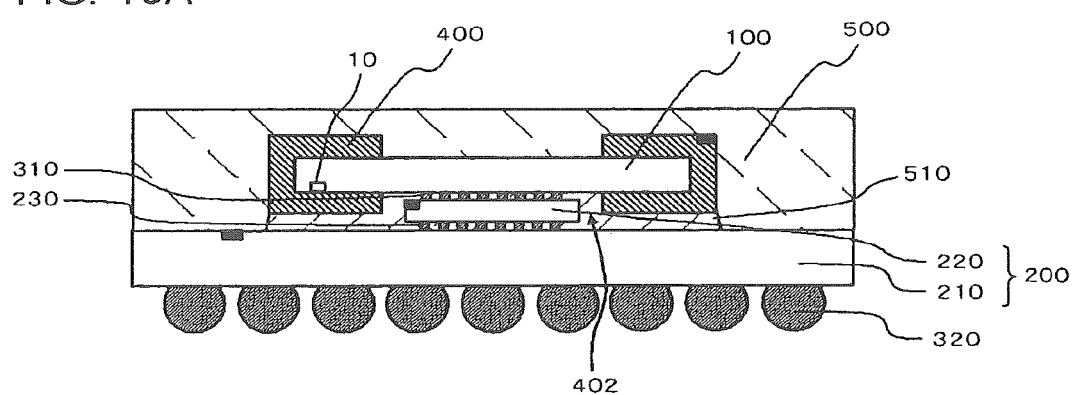
FIG. 10A is a cross-sectional view illustrating the configuration of a semiconductor device according to a fifth embodiment.
Figure 10B:
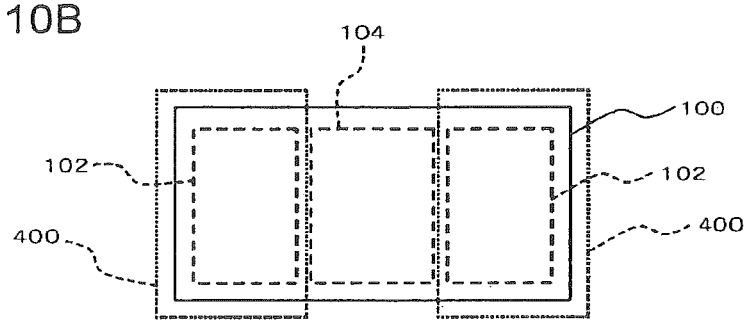
FIG. 10B is a top view of the semiconductor device illustrated in FIG. 10A.

FIG. 10A is a cross-sectional view illustrating the configuration of a semiconductor device according to a fifth embodiment and corresponds to FIG. 1 according to the first embodiment. FIG. 10B is a top view of the semiconductor device illustrated in FIG. 10A. The semiconductor device according to this embodiment has a configuration similar to one of the first to third embodiments except for the following points.

First, the semiconductor chip 100 includes a memory area 102 and a non-memory area 104. The memory area 102 is an area in which a magnetoresistive random access memory 10 is disposed, and the non-memory area 104 is an area in which the magnetoresistive random access memory 10 is not disposed. In the non-memory area 104, for example, a logic circuit is arranged. In addition, the magnetic shield layer 400 covers the memory area 102 when seen in a plan view and does not cover the non-memory area 104.

Described in more detail, in this embodiment, the magnetoresistive random access memory 10 is a device of a vertical spin-type illustrated in FIG. 2A. The semiconductor chip 100 has a rectangular shape. The memory area 102 is disposed on a side closer to one side of the semiconductor chip 100 than the non-memory area 104. The semiconductor chip 100 has a first face facing the interconnect substrate 200 and a second face opposite to the first face. The magnetic shield layer 400 is formed from the first face through the side face to the second face.

More specifically, the non-memory area 104 is disposed on the center side of the semiconductor chip 100, and the memory area 102 is disposed on both arm sides of the semiconductor chip 100. The memory area 102 of the semiconductor chip 100 is covered with the different magnetic shield layers 400. Each magnetic shield layer 400 completely convers one side face out of four side faces of the semiconductor chip 100 and does not cover two side faces connected to the above side face (corresponds to FIGS. 24A and 24B to be described later). Alternatively, as illustrated in FIG. 24D to be described later, the magnetic shield layer 400 may partially cover the above-described two side faces.

According to this embodiment, advantages similar to those of the first to third embodiments can be acquired. In addition, for a magnetic field formed in a direction perpendicular to the semiconductor chip 100, the magnetic shield layer 400 according to this embodiment has a shielding effect higher than the magnetic shield layer 400 according to the first embodiment. Accordingly, a possibility of erroneous writing or erroneous erasing for the magnetoresistive random access memory 10 is further lowered.

Sixth Embodiment

Figure 11A:
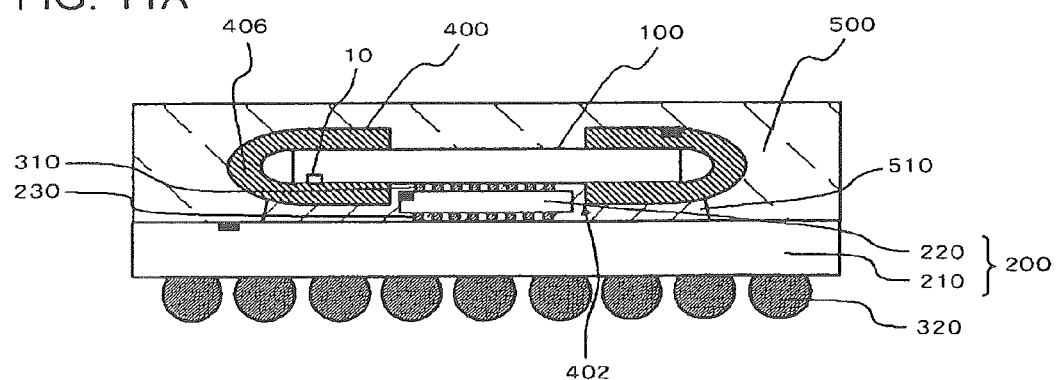
FIG. 11A is a cross-sectional view illustrating the configuration of a semiconductor device according to a sixth embodiment.
Figure 11B:
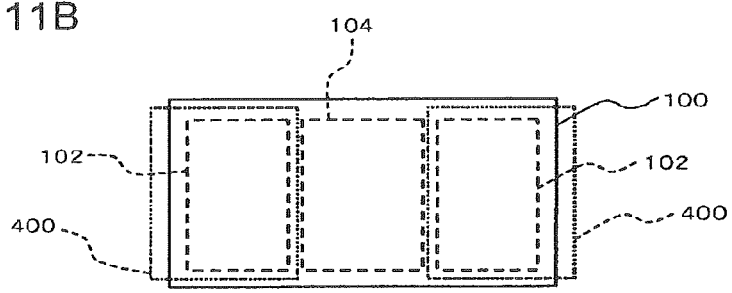
FIG. 11B is a top view of the semiconductor device illustrated in FIG. 11A.

FIG. 11A is a cross-sectional view illustrating the configuration of a semiconductor device according to a sixth embodiment and corresponds to FIG. 1 according to the first embodiment. FIG. 11B is a top view of the semiconductor device illustrated in FIG. 11A. The semiconductor device according to this embodiment has a configuration similar to the semiconductor device according to the fifth embodiment except for the shape of the magnetic shield layer 400.

In this embodiment, the magnetic shield layer 400 has a curved portion 406. The configuration of the curved portion 406 is similar to that according to the fourth embodiment.

According to this embodiment, advantages similar to those of the fifth embodiment can be acquired. In addition, similarly to the fourth embodiment, the manufacturing cost of the magnetic shield layer 400 can be lowered.

Seventh Embodiment

Figure 12A:
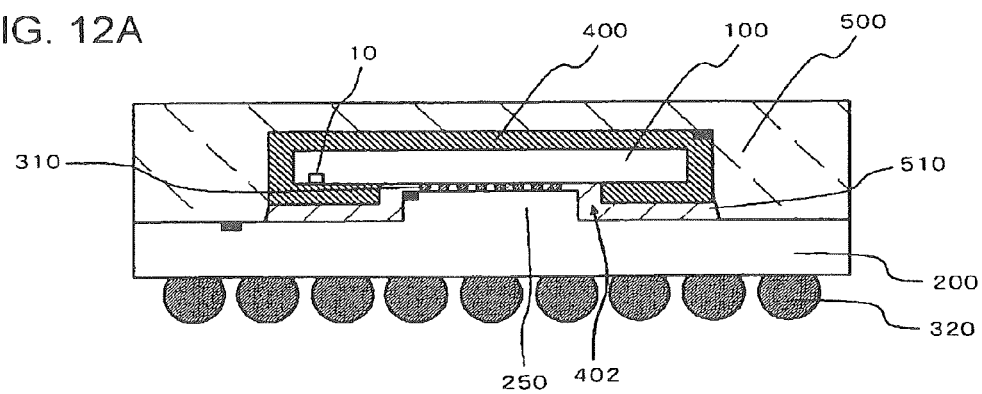
FIG. 12A is a cross-sectional view illustrating the configuration of a semiconductor device according to a seventh embodiment.

FIG. 12A is a cross-sectional view illustrating the configuration of a semiconductor device according to a seventh embodiment. The semiconductor device according to this embodiment is similar to one of the first to sixth embodiments except for the configuration of an interconnect substrate 200.

In this embodiment, the interconnect substrate 200 includes a concave portion 250. The surface of one interconnect substrate 200 is formed to be partially convex to form the convex portion 250. The convex portion 250 enters the inside of an opening 402 of a magnetic shield layer 400. Bumps 310 connect with the top face of the convex portion 250.

Figure 12B:
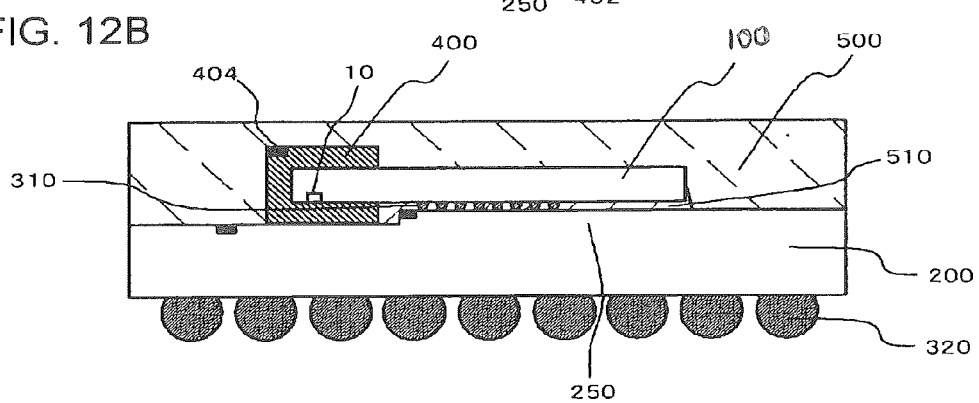
FIG. 12B is a cross-sectional view illustrating a modified example of the semiconductor device illustrated in FIG. 12A.

FIG. 12B is a cross-sectional view illustrating a modified example of the semiconductor device illustrated in FIG. 12A. In the example illustrated in the figure, the interconnect substrate 200 has a portion not facing the magnetic shield layer 400, and on the entirety of the portion the convex portion 250 is formed. The interconnect substrate 200 has an area in which the convex portion 250 is not formed. The magnetic shield layer 400 may contact with the area and may be separated from this area.

Figure 13:
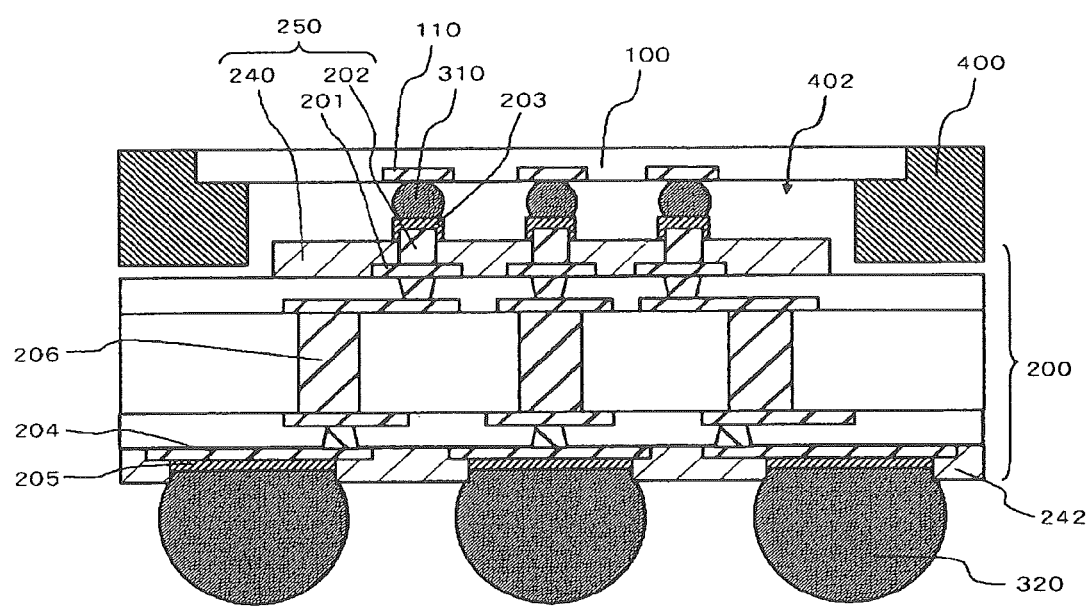
FIG. 13 is an enlarged cross-sectional view illustrating a detailed structure of a convex portion.

FIG. 13 is an enlarged cross-sectional view illustrating a detailed structure of the convex portion 250. In the example illustrated in this figure, the interconnect substrate 200 is a multi-layer interconnect layer including four or more layers. The convex portion 250 is configured by a protection layer 240, a metal pillar 202, and a metal layer 203. The protection layer 240, for example, is a solder resist, and partially coats the top face of the interconnect substrate 200. Here, the solder resist, for example, includes at least one of an epoxy resin, an acrylic resin, and a polyimide resin. The thickness of the protection layer 240, for example, is equal to or more than 20 μm and equal to or less than 60 μm. The metal pillar 202, for example, is formed from Cu. The interconnect substrate 200 has a face in which a soldering ball 320 is attached, and on the face a protection layer 242 is formed.

The interconnect substrate 200 has an area in which the protection layer 240 is formed, and in the area an electrode 201 is formed. The electrode 201, when seen in a plan view, is positioned on the inner side of the opening 402 of the magnetic shield layer 400. The metal pillar 202 connects to the electrode 201. The protection layer 240 passes through the metal pillar 202, and the upper end of the metal pillar 202 is positioned higher than the protection layer 240. The metal pillar 202, for example, is a Cu post, and, for example is formed by an electrolytic plating method. The height of the metal pillar 202, for example, is equal to or more than 60 μm and equal to or less than 120 μm.

In the upper end (including the upper end face and an upper end portion of the side face) of the metal pillar 202, the metal layer 203 is formed. The metal layer 203, for example, a Ni/Au layer or a Ni/Pd/Au layer and, for example, is formed by using a non-electrolytic plating method or an electrolytic plating method. The metal layer 203 is disposed so as to bond the bumps 310 to the metal pillar 202.

In addition, the electrode 201 connects to the electrode 204 through a via 206 disposed on a core layer. The electrode 204 is disposed on the rear face side of the interconnect substrate 200 and connects to the soldering ball 320 through the metal layer 205.

According to this embodiment, advantages similar to those of the first to sixth embodiments can be acquired.

Figure 14:
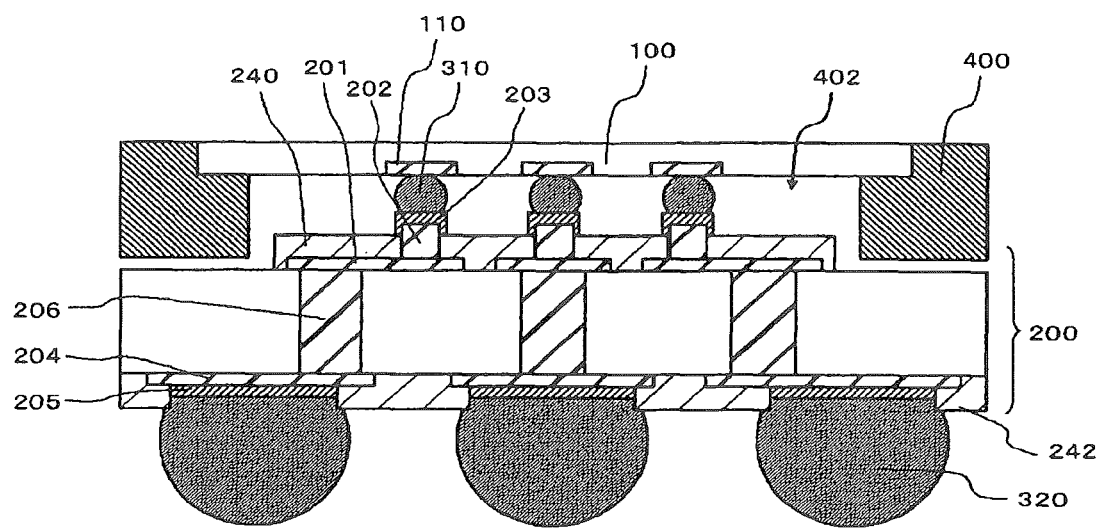
FIG. 14 is a cross-sectional view illustrating a modified example of the convex portion illustrated in FIG. 13.

In addition, as illustrated in FIG. 14, the interconnect substrate 200 may be a two-layer substrate in which interconnects are formed on the top face and the bottom face of the core layer. In such a case, the electrode 201 is formed on the top face of the core layer, and the electrode 204 is formed on the bottom face of the core layer.

Eighth Embodiment

Figure 15:
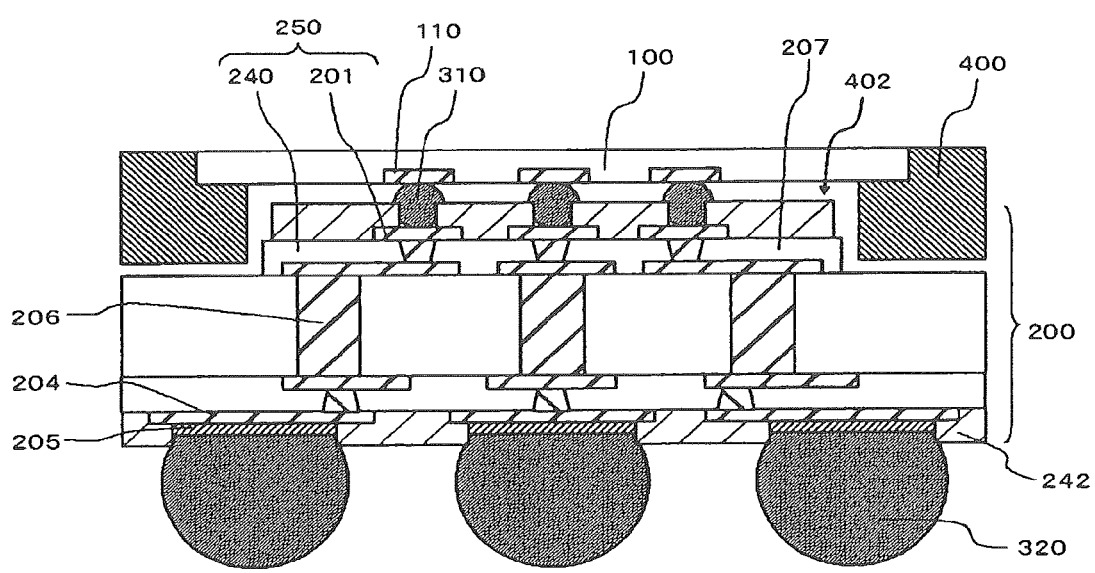
FIG. 15 is a cross-sectional view illustrating the configuration of a semiconductor device according to an eighth embodiment.

FIG. 15 is a cross-sectional view illustrating the configuration of a semiconductor device according to an eighth embodiment and corresponds to FIG. 13 according to the seventh embodiment. The semiconductor device according to this embodiment has a configuration similar to the semiconductor device according to the seventh embodiment except for the following points.

In this embodiment, the interconnect substrate 200 includes a build-up area 207 on an uppermost layer. The interconnect layer is partially built up to form the build-up area 207. In addition, a protection layer 240 is formed only on the build-up area 207. The build-up area 207 is formed in a portion overlapping with an opening 402 of the magnetic shield layer 400 when seen in a plan view. The build-up area 207 and the protection layer 240 configure a convex portion. This convex portion enters the inside of the opening 402.

On the electrode 201, the metal pillar 202 is not formed, and bumps 310 directly connect to the electrode 201. In order to ensure bonding to the bumps 310 on the top face, the electrode 201 includes a metal layer such as Ni/Au or Ni/Pd/Au.

In the interconnect layer positioned below one build-up area 207, the interconnect is formed only in a portion covered with the build-up area 207.

According to this embodiment, advantages similar to those of the seventh embodiment can be acquired.

In addition, in this embodiment, the interconnect substrate 200 has a face facing the semiconductor chip 100, and on the entirety of the face the protection layer 240 may be formed. The interconnect layer has a portion positioned below one build-up area 207, and the portion is not covered with the build-up area 207. In the above case, also in the portion, an interconnect can be formed.

Figure 16:
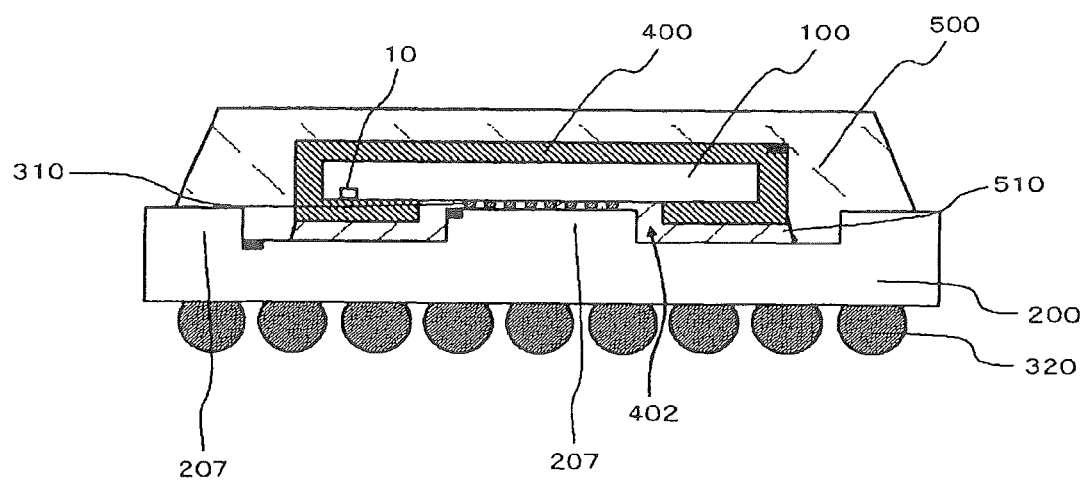
FIG. 16 is a cross-sectional view illustrating a modified example of the semiconductor device illustrated in FIG. 15.

As illustrated in FIG. 16, in an area not overlapping with the magnetic shield layer 400 when seen in a plan view, the build-up area 207 may be also formed in a place (for example, a portion positioned on the outer side of the magnetic shield layer 400 when seen in a plan view) not overlapping the opening 402.

Figure 17:
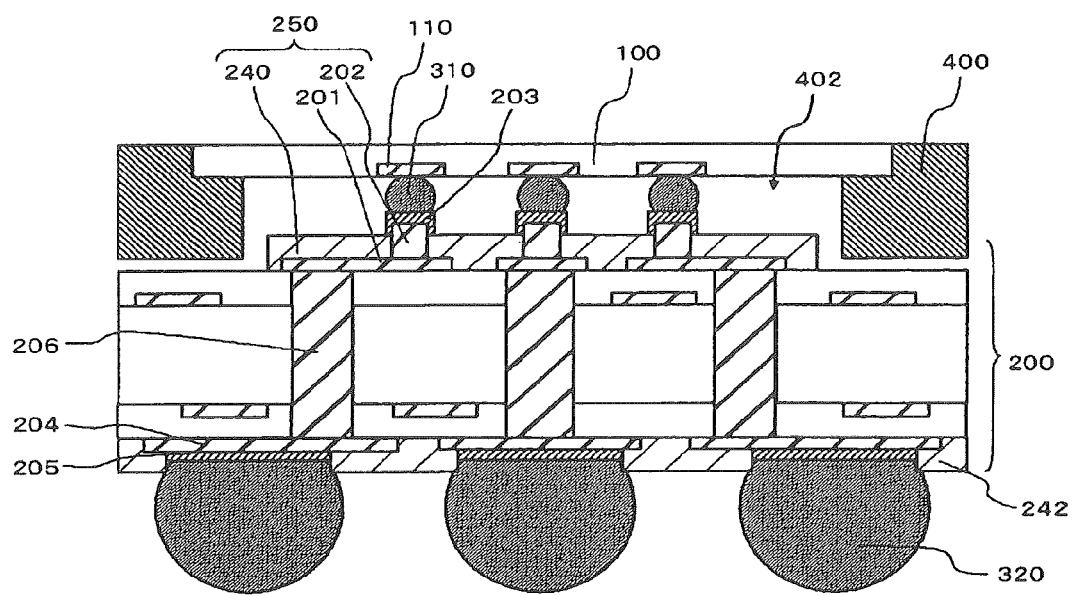
FIG. 17 is a cross-sectional view illustrating a modified example of the semiconductor device illustrated in FIG. 15.

As illustrated in FIG. 17, in the interconnect substrate 200, the electrode 201 may directly connect to the electrode 204 through one via 206.

Ninth Embodiment

Figure 18:
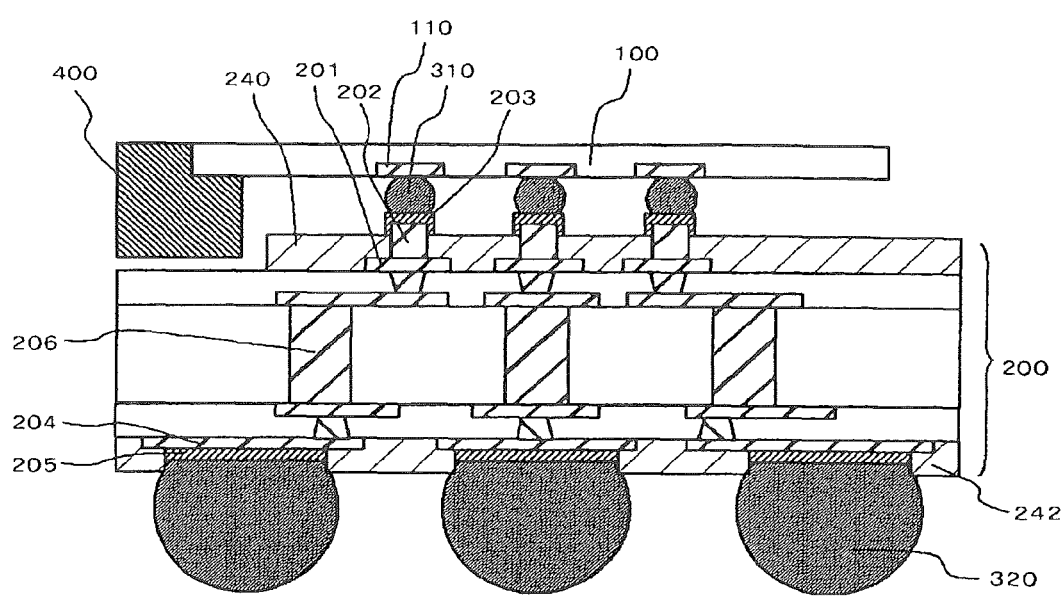
FIG. 18 is a cross-sectional view illustrating the configuration of a semiconductor device according to a ninth embodiment.

FIG. 18 is a cross-sectional view illustrating the configuration of a semiconductor device according to a ninth embodiment. The semiconductor device according to this embodiment has a configuration similar to that of the semiconductor device according to the seventh embodiment except for the following points.

First, a magnetic shield layer 400 is not formed in a portion of the side face of a semiconductor chip 100. The side face of the semiconductor chip 100 includes a portion in which the magnetic shield layer 400 is not formed, and the protection layer 240, when seen in a plan view, is continuously formed from the portion to the outer side of the semiconductor chip 100 from the inner side of the semiconductor chip 100, and the protection layer 240 is not overlapped with the magnetic shield layer 400.

According to this embodiment, advantages similar to those of the seventh embodiment can be acquired.

Tenth Embodiment

Figure 19:
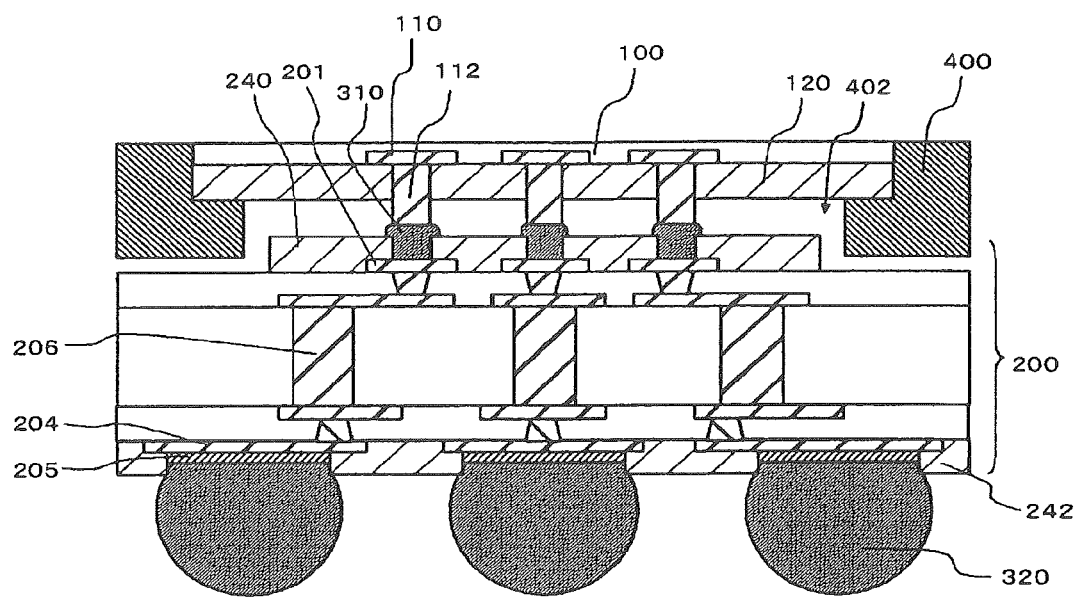
FIG. 19 is a cross-sectional view illustrating the configuration of a semiconductor device according to a tenth embodiment.

FIG. 19 is a cross-sectional view illustrating the configuration of a semiconductor device according to a tenth embodiment. The semiconductor device according to this embodiment has a configuration similar to that of the semiconductor device according to the eighth embodiment except for the following points.

First, a semiconductor chip 100 includes a metal pillar 112. The metal pillar 112 is formed on an electrode pad 110. On a multi-layer interconnect layer including the electrode pad 110, a protection layer 120 is formed. In the protection layer 120, an opening positioned on the electrode pad 110 is disposed, and the metal pillar 112 is formed inside the opening. The metal pillar 112, for example, is formed from Cu. The metal pillar 112 is formed to be higher than the protection layer 120, and the top end of the metal pillar 112 is convex from the protection layer 120. The height of the metal pillar 112, for example, is equal to or more than 60 μm and equal to or less than 120 μm.

On the end face of the metal pillar 112, bumps 310 are formed. Since the metal pillar 202 is not disposed in the interconnect substrate 200, the bumps 310 enter the inside of the openings formed in the protection layer 240. These openings are positioned above the electrode 201. The bumps 310 connects through an under bump metal (not illustrated in the figure) to the electrode 201.

Figure 20:
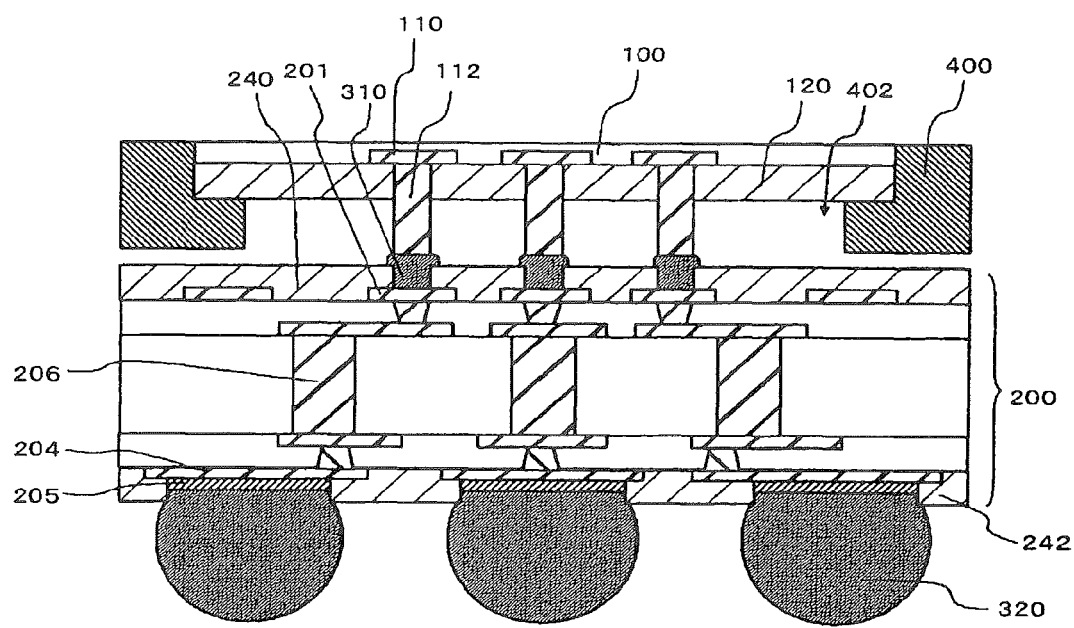
FIG. 20 is a cross-sectional view illustrating a first modified example of the semiconductor device illustrated in FIG. 19.

FIG. 20 is a cross-sectional view illustrating a first modified example of the semiconductor device illustrated in FIG. 19. This modified example has a configuration similar to FIG. 19 except for the following points. First, a protection layer 240 is formed on the entirety of the face of the interconnect substrate 200 (the face facing the semiconductor chip 100). The interconnect layer coated with the protection layer 240 includes an interconnect also in an area overlapping with a magnetic shield layer 400 when seen in a plan view.

In other words, in this embodiment, the semiconductor chip 100 includes a metal pillar 112 as a convex portion. Since the metal pillar 112 is formed to be higher than the protection layer 120, an advantage that is similar to that of a case where the convex portion is arranged on the interconnect substrate 200 according to the seventh embodiment can be acquired if the metal pillar 112 is arranged.

Figure 21:
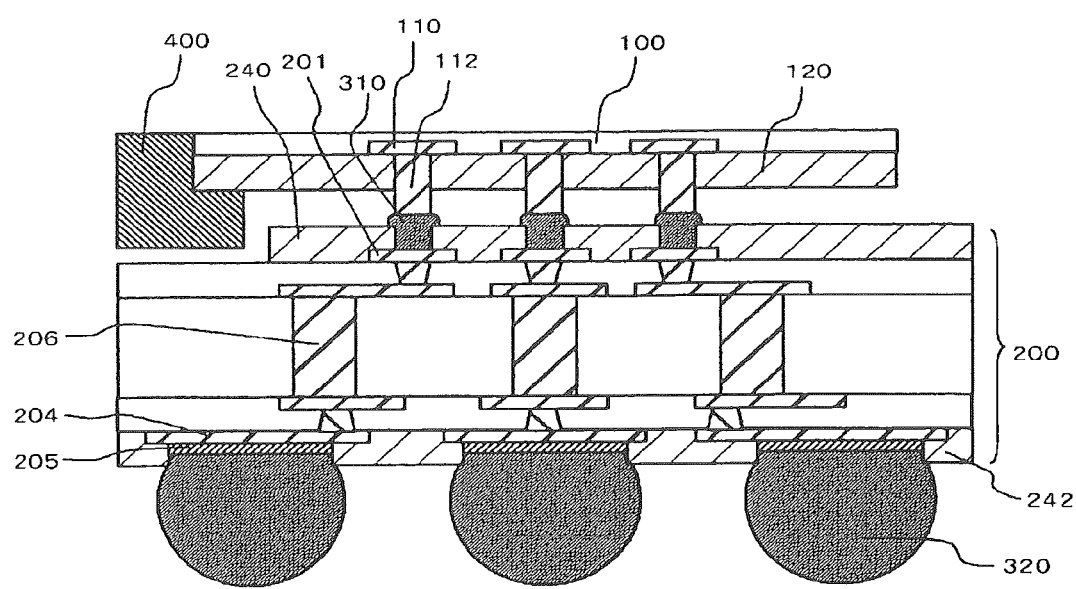
FIG. 21 is a cross-sectional view illustrating a second modified example of the semiconductor device illustrated in FIG. 19.

FIG. 21 is a cross-sectional view illustrating a second modified example of the semiconductor device illustrated in FIG. 19. This modified example has a configuration that is similar to FIG. 19 except for the following points. First, the magnetic shield layer 400 is not formed in a part of the side face of the semiconductor chip 100. The side face of the semiconductor chip 100 includes a portion in which the magnetic shield layer 400 is not formed, and the protection layer 240 is continuously formed from the portion to the outer side of the semiconductor chip 100 from the inner side of the semiconductor chip 100 when seen in a plan view, and the protection layer 240 is not overlapped with the magnetic shield layer 400.

According to this embodiment, advantages similar to those of the eighth embodiment can be acquired.

Eleventh Embodiment

Figure 22:
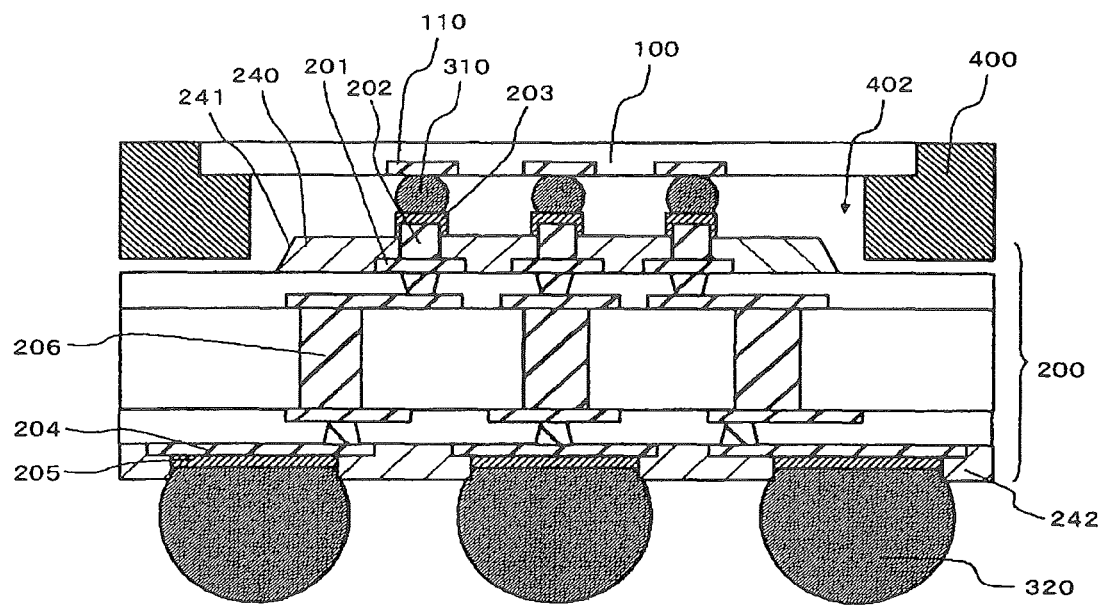
FIG. 22 is a cross-sectional view illustrating the configuration of a semiconductor device according to an eleventh embodiment.

FIG. 22 is a cross-sectional view illustrating the configuration of a semiconductor device according to an eleventh embodiment. A semiconductor device according to this embodiment has a configuration similar to the semiconductor device according to one of the seventh to tenth embodiments except that an end face 241 of the protection layer 240 upwardly tilts.

According to this embodiment, advantages similar to those of the seventh embodiment can be acquired. In addition, even if a magnetic shield layer 400 contacts with the end face 241 when a semiconductor chip 100 is mounted on the interconnect substrate 200, the lower end of the magnetic shield layer 400 slides along the end face 241 and the semiconductor chip 100 moves to an appropriate position for self aligning. Accordingly, the semiconductor chip 100 can be mounted on the interconnect substrate 200 more reliably.

Figure 23:
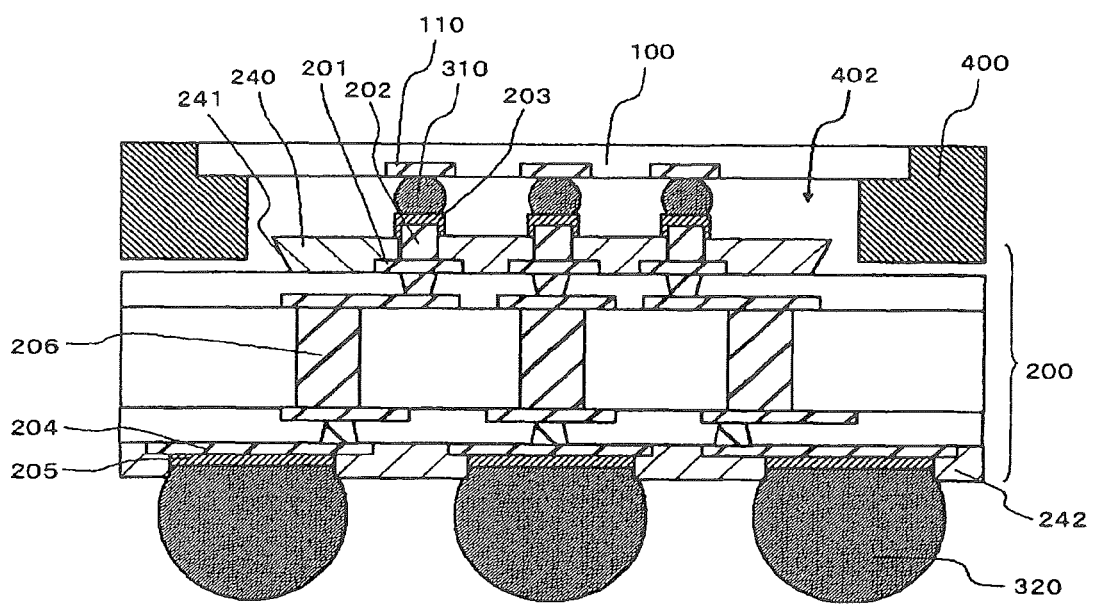
FIG. 23 is a cross-sectional view illustrating a modified example of the semiconductor device illustrated in FIG. 22.

As illustrated in FIG. 23, the end face 241 of the protection layer 240 may downwardly tilt.

FIGS. 24A to 24E and FIGS. 25A to 25D are perspective views illustrating modified examples of the magnetic shield layer 400 according to the first to eleventh embodiments. In each of the above-described modified examples, the magnetic layer 400 has a shape illustrated in one of FIGS. 24A, 24B, and 25A. Still, the shape of the magnetic shield layer 400 is not limited to them and, for example, may have a shape illustrated in any one of FIGS. 24A to 24E and FIGS. 25A to 25D.

Figure 24A:
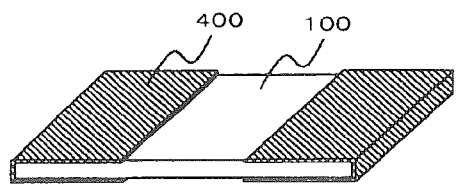
FIGS. 24A to 24E are perspective views illustrating modified examples of a magnetic shield layer.
Figure 24D:
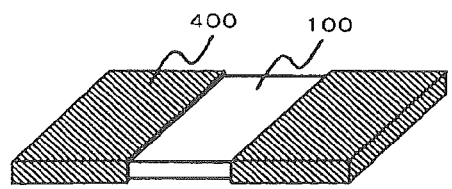
Figure 24B:
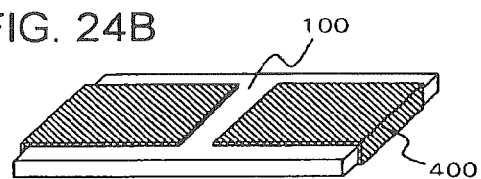

The example illustrated in FIG. 24B is different from the example illustrated in FIG. 24A that the width of the magnetic shield layer 400 is smaller than the width of the semiconductor chip 100. In addition, the edge of the semiconductor chip 100 is not coated with the magnetic field layer 400.

Figure 24E:
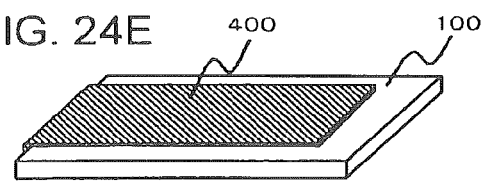
Figure 24C:
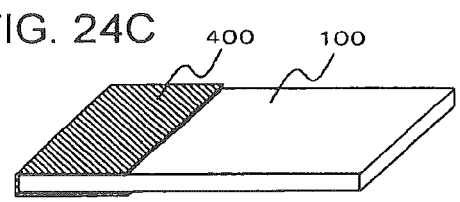

The example illustrated in FIG. 24C is different from the example illustrated in FIG. 24A that the magnetic shield layer 400 is disposed only in each area near one side of the semiconductor chip 100.

In the example illustrated in FIG. 24D, the magnetic shield layer 400 has a rectangular shape having a side face, and only the side face in the magnetic shield layer 400 is open for inserting the semiconductor chip 100. Two magnetic shield layers 400 are plugged from two facing side face sides of the semiconductor chip 100.

The example illustrated in FIG. 24E is different from the example illustrated in FIG. 24C that the width of the magnetic shield layer 400 is smaller than that of the semiconductor chip 100, and the magnetic shield layer 400 is long in the longitudinal direction. The end portion of the magnetic shield layer 400 extends from a portion of the active faces (faces on which electrode pads are formed) of the semiconductor chip 100 near one side face of the semiconductor chip 100, through a side face opposite to the one side face, to a portion of the rear face of the semiconductor chip 100 near the above-described one side face.

Figure 25A:
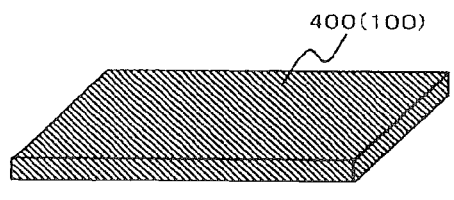
FIGS. 25A to 25D are perspective views illustrating modified examples of a magnetic shield layer.
Figure 25B:
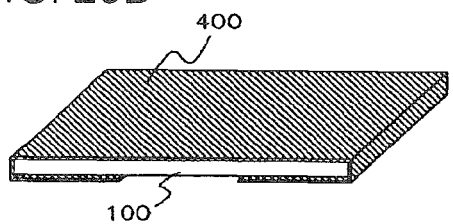

The example illustrated in FIG. 25B is different from the example illustrated in FIG. 25A that the opening 402 connects to two facing side faces of the semiconductor chip 100 in the magnetic shield layer 400. In addition, the magnetic shield layer 400 does not cover the two side faces and covers the remaining two side faces.

Figure 25C:
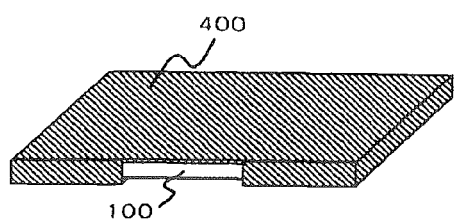

The example illustrated in FIG. 25C is different from the example illustrated in FIG. 25B that, although the opening 402 is continuously formed up to two facing side faces of the semiconductor chip 100 in the magnetic shield layer 400, other portions of the two side faces are coated with the magnetic shield layer 400.

Figure 25D:
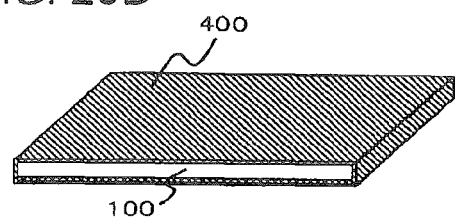

The example illustrated in FIG. 25D is different from the example illustrated in FIG. 25A that two facing side faces are not covered in the magnetic shield layer 400.

Figure 26A:
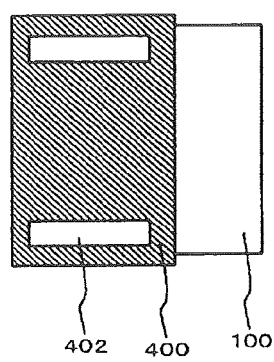
FIGS. 26A to 26C are plan views illustrating modified examples of an opening of a magnetic shield layer.
Figure 26B:
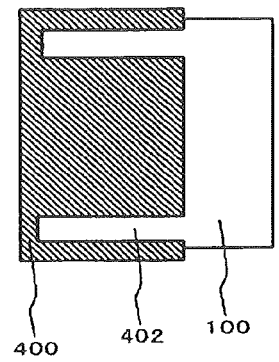
Figure 26C:
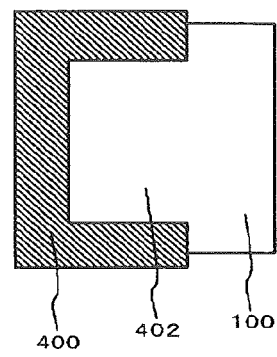
Figure 27A:
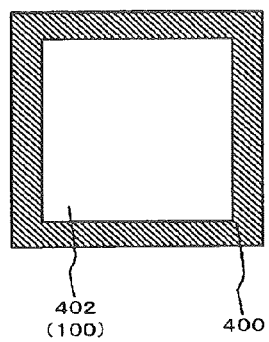
FIGS. 27A to 27C are plan views illustrating modified examples of an opening of a magnetic shield layer.
Figure 27B:
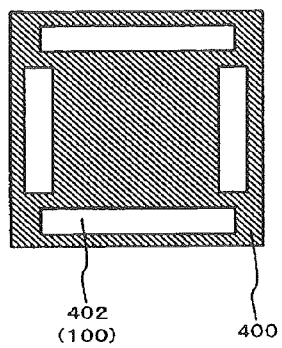
Figure 27C:
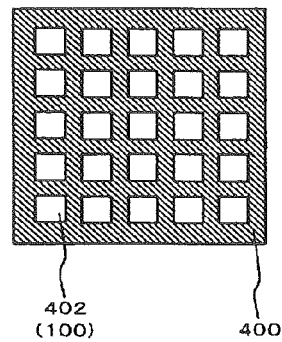

FIGS. 26A to 26C are diagrams illustrating examples of the shapes of the openings 402 in the examples illustrated in FIGS. 24A to 24E. FIGS. 27A to 27C are diagrams illustrating examples of the shapes of the openings 402 in the examples illustrated in FIGS. 25A to 25D. The semiconductor chip 100 has an area in which the electrode pad is disposed, and in any of the above-described examples, the opening 402 is formed in the area.

In the examples illustrated in FIGS. 26A and 26B, the electrode pad of the semiconductor chip 100 is formed along two facing sides of the semiconductor chip 100. The opening 402 extends along the two facing side faces of the semiconductor chip 100. In addition, as illustrated in FIG. 26A, there is a case where the opening 402 has a shape closed inside the magnetic shield layer 400, and, as illustrated in FIG. 26B, there is a case where the opening 402 connects to the edge of the magnetic shield layer 400 so as to be open.

In the examples illustrated in FIGS. 26C and 27A, the electrode pad of the semiconductor chip 100 is formed on the entire face of the semiconductor chip 100 except for the edge of the semiconductor chip 100. In such a case, the opening 402 is formed in portions facing the active face of the semiconductor chip 100 except for the edge.

In the examples illustrated in FIG. 27B, the electrode pad of the semiconductor chip 100 is formed along the four side faces of the semiconductor chip 100. In addition, the opening 402 extends along the four side faces of the semiconductor chip 100.

In the examples illustrated in FIG. 27C, the electrode pads 402 are separately disposed.

Figure 28:
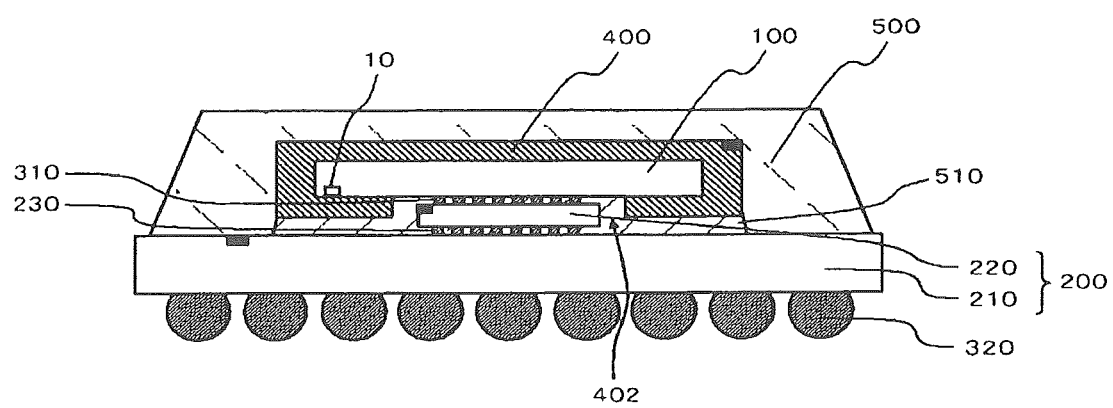
FIG. 28 is a cross-sectional view illustrating a modified example of a magnetic shield layer.

In the examples illustrated in FIGS. 24A to 24E and FIGS. 25A to 25D, as illustrated in FIG. 28, the magnetic shield layer 400 has a portion formed along the side face of the semiconductor chip 100, and the portion may be formed to be thicker than a portion facing the active face of the semiconductor chip 100 and than the opposite face.

The magnetic shield layer 400 allows magnetic fluxes to pass through the inside of the magnetic layer 400 so as to prevent a magnetic field from being applied to the semiconductor chip 100. A portion of the magnetic shield layer 400 in which the magnetic flux is highest is a portion of the magnetic shield layer 400 disposed along the side face of the semiconductor chip 100. In the example illustrated in FIG. 28, the magnetic shield layer 400 has a portion disposed along the side face of the semiconductor layer 100, and the portion is thicker than the other portions. Accordingly, the capacity of passing the magnetic fluxes in this portion increases. The magnetic shielding capability of the magnetic shield layer 400 is thus improved.

In addition, in a case the magnetic shield layer 400 wraps around from one face (active face) side of the semiconductor chip 100 to the other face (rear face) of the semiconductor chip 100 through the side face of the semiconductor ship 100, it is preferable that, as illustrated in FIGS. 26A to 26C, the opening 402 having a long shape along the side face is not formed on the magnetic shield layer 400.

As described above, the magnetic shield layer 400 allows magnetic fluxes to pass through the inside of the magnetic layer 400 so as to prevent a magnetic field from being applied to the semiconductor chip 100. In a case where the magnetic shield layer 400 wraps around from one face (the active face) side to the other (the rear face) side of the semiconductor chip 100 through the side face of the semiconductor chip 100, magnetic fluxes in the magnetic shield layer 400 flow from a portion located on the one face (the active face) side of the semiconductor chip 100 to a portion located on the other face (rear face) side of the semiconductor chip 100 through a portion facing the side face of the semiconductor chip 100. Yet, if the opening 402 having a long shape along the side face is formed in the magnetic shield layer 400, a portion through which the magnetic fluxes flow decreases near the side face, and accordingly, the capacity of passing the magnetic fluxes decreases. In such a case, the magnetic shielding capability of the magnetic shield layer 400 decreases.

Twelfth Embodiment

Figure 29:
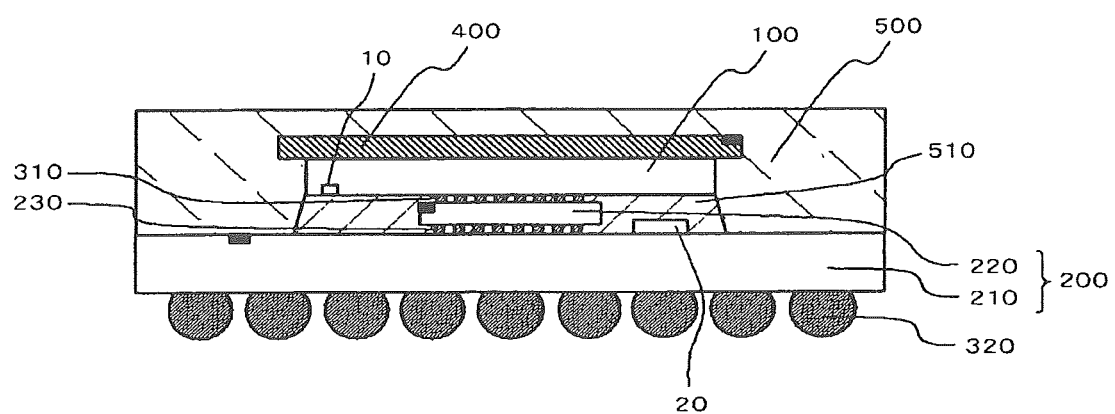
FIG. 29 is a cross-sectional view illustrating the configuration of a semiconductor device according to a twelfth embodiment.

FIG. 29 is a cross-sectional view illustrating the configuration of a semiconductor device according to a twelfth embodiment. The semiconductor device according to this embodiment has a configuration similar to that of one of the semiconductor devices according to the first to eleventh embodiments. FIG. 29 illustrates a case where the configuration is similar to that according to the second embodiment.

First, the magnetoresistive random access memory 10 is a device of a horizontal spin type. A magnetic shield layer 400 is disposed only on the rear face side (an upper face in the figure) of the semiconductor chip 100. In addition, the interconnect substrate 200 has a portion facing the semiconductor chip 100, and a device 20 is mounted in the portion other than a convex portion (a second interconnect substrate 220 in the example illustrated in the figure). The device 20 may be a semiconductor chip or another discrete component.

According to this embodiment, in the area overlapping with the semiconductor chip 100 when the interconnect substrate 200 is seen in a plan view, an electronic component other than the semiconductor chip 100 can be mounted.

Figure 30A:
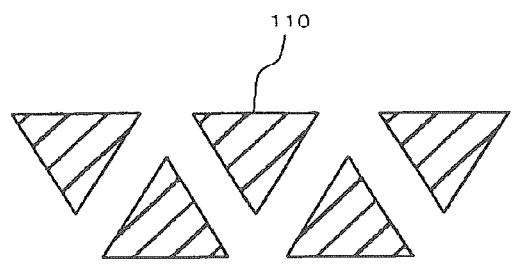
FIGS. 30A to 30C are plan views illustrating modified examples of the planar shape of an electrode pad.
Figure 30B:
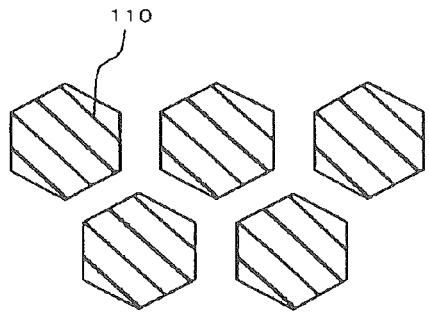
Figure 30C:
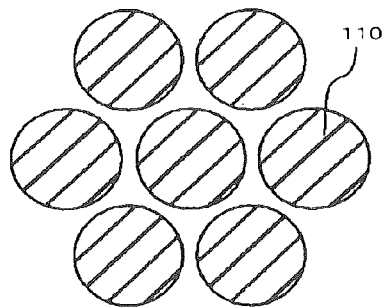

In addition, in each embodiment described above, the planar shape of the electrode pad 110 may not be rectangular. For example, as illustrated in FIGS. 30A to 30C, the shape of the electrode pad 110 may be a regular triangle (FIG. 30A), a regular hexagon (FIG. 30B), or a circle (FIG. 30O). In such a case, the arrangement density of the electrode pads 110 can increase if the electrode pads 110 are arranged in a staggered pattern.

As above, although the embodiments of the present invention have been described, these are examples of the present invention, and various configurations other than the description presented above may be employed.

It is apparent that the present invention is not limited to the above embodiment, and may be modified and changed without departing from the scope and spirit of the invention.

What is claimed is:

1. A semiconductor device comprising:
    a substrate;
    a semiconductor chip formed on the substrate and having a first main surface facing the substrate, a second main surface opposite to the first main surface, and a side surface arranged between the first main surface and the second main surface;
    a magnetic storage device formed on the first main surface;
    a first magnetic shield overlaying on the first main surface;
    a second magnetic shield overlaying on the second main surface, the magnetic storage device being formed between the first and second magnetic shields; and
    a third magnetic shield overlaying on the side surface,
    wherein the first and second magnetic shields are mechanically connected via the third magnetic shield.

2. The semiconductor device according to claim 1,
    wherein the semiconductor chip comprises a first area and a second area without the first area on the first main surface in a plan view,
    wherein the magnetic storage device is arrayed on the first area,
    wherein the first area is covered with the first magnetic shield, and
    wherein a plurality of first electrodes are arrayed on the second area.

3. The semiconductor device according to claim 2, further comprising a substrate, the substrate comprising a first surface and a second surface opposite to the first surface,
    wherein the substrate includes a plurality of second electrodes on the first surface, a plurality of external electrodes on the second surface and a plurality of wirings,
    wherein the semiconductor chip is mounted on the first surface,
    wherein the first electrodes on the second area are electrically connected to the second electrodes on the first surface, and
    wherein the second electrodes and the external electrodes are electrically connected via the wirings.

4. The semiconductor device according to claim 3, wherein a sealing body resin seals the semiconductor chip, the first, second and third magnetic shields, and the first surface of the substrate.

5. The semiconductor device according to claim 1, further comprising
    a fourth magnetic shield overlaying on the first main surface;
    a fifth magnetic shield overlaying on the second main surface; and
    a sixth magnetic shield overlaying on the side surface,
    wherein the fourth and fifth magnetic shields are mechanically connected via the sixth magnetic shield.

6. The semiconductor device according to claim 5, wherein the first magnetic shield mechanically separates with the fourth magnetic shield,
    wherein the second magnetic shield mechanically separates with the fifth magnetic shield, and
    wherein the third magnetic shield mechanically separates with the sixth magnetic shield.

7. The semiconductor device according to claim 6, wherein the semiconductor chip comprises a first area, a second area and a third area on the first main surface in a plan view,
    wherein the third area does not overlap with the first area and the second area,
    wherein the magnetic storage device is arrayed on the first area and the second area which are covered with the first and fourth magnetic shields, and wherein a plurality of electrodes are arrayed on the third area.

8. The semiconductor device according to claim 7, wherein the semiconductor chip comprises a fourth area, a fifth area and a sixth area on the second main surface in the plan view,
    wherein the sixth area does not overlap with the fourth and the fifth area,
    wherein the first area is overlapped with the fourth area in the plan view,
    wherein the second area is overlapped with the fifth area in the plan view, and
    wherein the third area is overlapped with the sixth area in the plan view.

9. The semiconductor device according to claim 8, further comprising a substrate, the substrate including a first surface and a second surface opposite to the first surface,
    wherein the substrate includes a plurality of second electrodes on the first surface, and a plurality of external electrodes on the second surface,
    wherein the semiconductor chip is mounted on the first surface,
    wherein the first electrodes on the second area are electrically connected to the second electrodes on the first surface, and
    wherein the second electrodes and the external electrodes are electrically connected.

10. The semiconductor device according to claim 9,
    wherein a sealing body resin seals the semiconductor chip, the first, second, third, fourth, fifth and sixth magnetic shields and the first surface of the substrate.

11. The semiconductor device according to claim 2,
    wherein the semiconductor chip includes a logic circuit, and
    wherein the logic circuit is arranged on the second area of the first main surface of the semiconductor chip.

12. The semiconductor device according to claim 7,
    wherein the semiconductor chip includes a logic circuit, and
    wherein the logic circuit is arranged on the third area of the first main surface of the semiconductor chip.

13. The semiconductor device according to claim 1, wherein said semiconductor chip comprises a first portion and a second portion,
    wherein the first portion includes the first main surface, and
    wherein the second portion does not include the first magnetic shield.

14. The semiconductor device according to claim 13, wherein the first portion includes the magnetic storage device.

15. The semiconductor device according to claim 13, wherein the second portion includes a plurality of electrodes.

16. The semiconductor device according to claim 13, wherein said second portion in located at a center of said semiconductor chip.

17. The semiconductor device according to claim 13, wherein the first portion is located closer to a side of said semiconductor chip than the second portion.

18. The semiconductor device according to claim 13, further comprising a third portion,
    wherein the third portion is covered with a fourth magnetic shield.

19. The semiconductor device according to claim 18, wherein said second portion is located between the first portion and the third portion.

20. A semiconductor device comprising:
    a substrate;
    a semiconductor chip formed on the substrate and comprising:
        a first main surface facing the substrate and including a first memory area;
        a second main surface opposite to the first main surface;
        a first side surface connecting the first main surface and the second main surface; and
        a second side surface opposite the first side surface and connecting the first main surface and the second main surface;
    a magnetic storage device formed in the first memory area of the first main surface of the semiconductor chip; and
    a magnetic shield layer comprising:
        a first magnetic shield formed on the first main surface and between the semiconductor chip and the substrate;
        a second magnetic shield formed on the second main surface, the magnetic storage device being formed between the first and second magnetic shields;
        a third magnetic shield formed on the first side surface, and connecting the first and second magnetic shields,
        a fourth magnetic shield formed on the first main surface and between the semiconductor chip and the substrate;
        a fifth magnetic shield formed on the second main surface; and
        a sixth magnetic shield formed on the second side surface of the semiconductor chip and connecting the fourth and fifth magnetic shields.

21. The semiconductor device according to claim 20, further comprising:
    a sealing resin formed on the first main surface of the semiconductor chip between the first and fourth magnetic shields such that the first magnetic shield is separated from the fourth magnetic shield, and formed on the second main surface of the semiconductor chip between the second and fifth magnetic shields such that the second magnetic shield is separated from the fifth magnetic shield.

22. The semiconductor device according to claim 20, wherein the first main surface of the semiconductor chip further comprises:
    a non-memory area formed adjacent the first memory area in a central portion of the first main surface; and
    a second memory area formed on the first main surface, such that the non-memory area is formed between the first and second memory areas.

23. The semiconductor device according to claim 22, wherein the second memory area is formed between the fourth and fifth magnetic shields.

24. The semiconductor device according to claim 22, wherein the substrate comprises:
    a first substrate; and
    a second substrate formed between the first substrate and the semiconductor chip, and having a size which is less than a size of the first substrate, and
    wherein the second substrate is connected to the non-memory area of the first main surface of the semiconductor chip.

* * * * *